(12) United States Patent
Wolrich et al.

(10) Patent No.: US 6,876,561 B2
(45) Date of Patent: Apr. 5, 2005

(54) SCRATCHPAD MEMORY

(75) Inventors: Gilbert Wolrich, Framingham, MA (US); Debra Bernstein, Sudbury, MA (US); Matthew Adiletta, Worcester, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/726,757

(22) Filed: Dec. 3, 2003

(65) Prior Publication Data

US 2004/0109369 A1 Jun. 10, 2004

Related U.S. Application Data

(63) Continuation of application No. 10/457,337, filed on Jun. 9, 2003, now Pat. No. 6,667,920, which is a continuation of application No. 10/010,334, filed on Oct. 22, 2001, now Pat. No. 6,577,542, which is a continuation of application No. 09/473,111, filed on Dec. 28, 1999, now Pat. No. 6,307,789.

(51) Int. Cl.[7] .................................................. G11C 7/00
(52) U.S. Cl. ........................................ 365/49; 365/201
(58) Field of Search .................... 365/49, 201; 709/201, 709/208, 204

(56) References Cited

U.S. PATENT DOCUMENTS

| | | |
|---|---|---|
| 3,373,408 A | 3/1968 | Ling |
| 3,478,322 A | 11/1969 | Evans |
| 3,792,441 A | 2/1974 | Wymore et al. |
| 3,940,745 A | 2/1976 | Sajeva |
| 4,130,890 A | 12/1978 | Adam |
| 4,400,770 A | 8/1983 | Chan et al. |
| 4,514,807 A | 4/1985 | Nogi |
| 4,523,272 A | 6/1985 | Fukunaga et al. |
| 4,745,544 A | 5/1988 | Renner et al. |
| 4,866,664 A | 9/1989 | Burkhardt, Jr. et al. |
| 5,140,685 A | 8/1992 | Sipple et al. |
| 5,142,683 A | 8/1992 | Burkhardt, Jr. et al. |
| 5,155,831 A | 10/1992 | Emma et al. |
| 5,155,854 A | 10/1992 | Flynn et al. |
| 5,168,555 A | 12/1992 | Byers et al. |
| 5,173,897 A | 12/1992 | Schrodi et al. |
| 5,255,239 A | 10/1993 | Taborn et al. |
| 5,263,169 A | 11/1993 | Genusov et al. |
| 5,347,648 A | 9/1994 | Stamm et al. |
| 5,367,678 A | 11/1994 | Lee et al. |
| 5,390,329 A | 2/1995 | Gaertner et al. |
| 5,392,391 A | 2/1995 | Caulk, Jr. et al. |
| 5,392,411 A | 2/1995 | Ozaki |
| 5,392,412 A | 2/1995 | McKenna |
| 5,404,464 A | 4/1995 | Bennett |
| 5,404,482 A | 4/1995 | Stamm et al. |
| 5,432,918 A | 7/1995 | Stamm |
| 5,448,702 A | 9/1995 | Garcia, Jr. et al. |
| 5,450,351 A | 9/1995 | Heddes |
| 5,452,437 A | 9/1995 | Richey et al. |
| 5,459,842 A | 10/1995 | Begun et al. |

(Continued)

FOREIGN PATENT DOCUMENTS

| | | |
|---|---|---|
| EP | 0 379 709 | 8/1990 |
| EP | 0 464 715 | 1/1992 |
| EP | 0 633 678 | 1/1995 |

(Continued)

OTHER PUBLICATIONS

U.S. Appl. No. 10/684,078, filed Oct. 10, 2003, Wolrich et al.

(Continued)

*Primary Examiner*—Son T. Dinh
(74) *Attorney, Agent, or Firm*—Fish & Richardson P.C.

(57) ABSTRACT

An integrated circuit includes a random access memory (RAM) storage and a controller both located on one semiconductor chip. The controller is coupled to read data from and write data to the RAM storage. The controller is programmable to perform bitwise operations on data words stored in the RAM.

13 Claims, 8 Drawing Sheets

U.S. PATENT DOCUMENTS

| | | |
|---|---|---|
| 5,463,625 A | 10/1995 | Yasrebi |
| 5,467,452 A | 11/1995 | Blum et al. |
| 5,517,648 A | 5/1996 | Bertone et al. |
| 5,542,070 A | 7/1996 | LeBlanc et al. |
| 5,542,088 A | 7/1996 | Jennings, Jr. et al. |
| 5,544,236 A | 8/1996 | Andruska et al. |
| 5,550,816 A | 8/1996 | Hardwick et al. |
| 5,557,766 A | 9/1996 | Takiguchi et al. |
| 5,568,617 A | 10/1996 | Kametani |
| 5,574,922 A | 11/1996 | James |
| 5,592,622 A | 1/1997 | Isfeld et al. |
| 5,613,071 A | 3/1997 | Rankin et al. |
| 5,613,136 A | 3/1997 | Casavant et al. |
| 5,623,489 A | 4/1997 | Cotton et al. |
| 5,627,829 A | 5/1997 | Gleeson et al. |
| 5,630,130 A | 5/1997 | Perotto et al. |
| 5,644,623 A | 7/1997 | Gutledge |
| 5,649,157 A | 7/1997 | Williams |
| 5,659,687 A | 8/1997 | Kim et al. |
| 5,680,641 A | 10/1997 | Sidman |
| 5,689,566 A | 11/1997 | Nguyen |
| 5,699,537 A | 12/1997 | Sharangpani et al. |
| 5,717,898 A | 2/1998 | Kagan et al. |
| 5,721,870 A | 2/1998 | Matsumoto |
| 5,742,587 A | 4/1998 | Zornig et al. |
| 5,742,782 A | 4/1998 | Ito et al. |
| 5,742,822 A | 4/1998 | Motomura |
| 5,745,913 A | 4/1998 | Pattin et al. |
| 5,751,987 A | 5/1998 | Mahant-Shetti et al. |
| 5,761,507 A | 6/1998 | Govett |
| 5,761,522 A | 6/1998 | Hisanga et al. |
| 5,781,774 A | 7/1998 | Krick |
| 5,784,649 A | 7/1998 | Begur et al. |
| 5,784,712 A | 7/1998 | Byers et al. |
| 5,796,413 A | 8/1998 | Shipp et al. |
| 5,797,043 A | 8/1998 | Lewis et al. |
| 5,809,235 A | 9/1998 | Sharma et al. |
| 5,809,530 A | 9/1998 | Samra et al. |
| 5,812,868 A | 9/1998 | Moyer et al. |
| 5,828,746 A | 10/1998 | Ardon |
| 5,828,863 A | 10/1998 | Barrett et al. |
| 5,832,215 A | 11/1998 | Kato et al. |
| 5,835,755 A | 11/1998 | Stellwagen, Jr. |
| 5,854,922 A | 12/1998 | Gravenstein et al. |
| 5,860,158 A | 1/1999 | Pai et al. |
| 5,886,992 A | 3/1999 | Raatikainen et al. |
| 5,887,134 A | 3/1999 | Ebrahim |
| 5,890,208 A | 3/1999 | Kwon |
| 5,892,979 A | 4/1999 | Shiraki et al. |
| 5,905,876 A | 5/1999 | Pawlowski et al. |
| 5,905,889 A | 5/1999 | Wilhelm, Jr. |
| 5,915,123 A | 6/1999 | Mirsky et al. |
| 5,937,187 A | 8/1999 | Kosche et al. |
| 5,938,736 A | 8/1999 | Muller et al. |
| 5,940,612 A | 8/1999 | Brady et al. |
| 5,940,866 A | 8/1999 | Chisholm et al. |
| 5,946,487 A | 8/1999 | Dangelo |
| 5,948,081 A | 9/1999 | Foster |
| 5,958,031 A | 9/1999 | Kime |
| 5,961,628 A | 10/1999 | Nguyen et al. |
| 5,970,013 A | 10/1999 | Fischer et al. |
| 5,978,838 A | 11/1999 | Mohammed et al. |
| 5,983,274 A | 11/1999 | Hyder et al. |
| 6,012,151 A | 1/2000 | Mano |
| 6,014,729 A | 1/2000 | Lannan et al. |
| 6,023,742 A | 2/2000 | Ebeling et al. |
| 6,058,168 A | 5/2000 | Braband |
| 6,067,585 A | 5/2000 | Hoang |
| 6,070,231 A | 5/2000 | Ottinger |
| 6,072,781 A | 6/2000 | Feeney et al. |
| 6,073,215 A | 6/2000 | Snyder |
| 6,079,008 A | 6/2000 | Clery, III |
| 6,085,215 A | 7/2000 | Ramakrishnan et al. |
| 6,085,294 A | 7/2000 | Van Doren et al. |
| 6,092,127 A | 7/2000 | Tausheck |
| 6,092,158 A | 7/2000 | Harriman et al. |
| 6,112,016 A | 8/2000 | MacWilliams et al. |
| 6,134,665 A | 10/2000 | Klein et al. |
| 6,141,689 A | 10/2000 | Yasrebi |
| 6,141,765 A | 10/2000 | Sherman |
| 6,144,669 A | 11/2000 | Williams et al. |
| 6,145,054 A | 11/2000 | Mehrotra et al. |
| 6,157,955 A | 12/2000 | Narad et al. |
| 6,160,562 A | 12/2000 | Chin et al. |
| 6,182,177 B1 | 1/2001 | Harriman |
| 6,195,676 B1 | 2/2001 | Spix et al. |
| 6,199,133 B1 | 3/2001 | Schnell |
| 6,201,807 B1 | 3/2001 | Prasanna |
| 6,212,542 B1 | 4/2001 | Kahle et al. |
| 6,212,611 B1 | 4/2001 | Nizar et al. |
| 6,216,220 B1 | 4/2001 | Hwang |
| 6,223,207 B1 | 4/2001 | Lucovsky et al. |
| 6,223,238 B1 | 4/2001 | Meyer et al. |
| 6,223,279 B1 | 4/2001 | Nishimura et al. |
| 6,247,025 B1 | 6/2001 | Bacon |
| 6,256,713 B1 | 7/2001 | Audityan et al. |
| 6,272,616 B1 | 8/2001 | Fernando et al. |
| 6,275,505 B1 | 8/2001 | O'Loughlin et al. |
| 6,279,113 B1 | 8/2001 | Vaidya |
| 6,289,011 B1 | 9/2001 | Seo et al. |
| 6,298,370 B1 | 10/2001 | Tang et al. |
| 6,307,789 B1 | 10/2001 | Wolrich et al. |
| 6,324,624 B1 | 11/2001 | Wolrich et al. |
| 6,345,334 B1 | 2/2002 | Nakagawa et al. |
| 6,347,344 B1 | 2/2002 | Baker et al. |
| 6,356,962 B1 | 3/2002 | Kasper |
| 6,360,262 B1 | 3/2002 | Guenthner et al. |
| 6,373,848 B1 | 4/2002 | Allison et al. |
| 6,389,449 B1 | 5/2002 | Nermirovsky et al. |
| 6,393,483 B1 | 5/2002 | Latif et al. |
| 6,415,338 B1 | 7/2002 | Habot |
| 6,426,940 B1 | 7/2002 | Seo et al. |
| 6,427,196 B1 | 7/2002 | Adiletta et al. |
| 6,430,626 B1 | 8/2002 | Witkowski et al. |
| 6,434,145 B1 | 8/2002 | Opsasnick et al. |
| 6,453,404 B1 * | 9/2002 | Bereznyi et al. ............ 711/171 |
| 6,463,072 B1 | 10/2002 | Wolrich et al. |
| 6,532,509 B1 | 3/2003 | Wolrich et al. |
| 6,552,826 B2 | 4/2003 | Adler et al. |
| 6,560,667 B1 | 5/2003 | Wolrich et al. |
| 6,577,542 B2 | 6/2003 | Wolrich et al. |
| 6,584,522 B1 | 6/2003 | Wolrich et al. |
| 6,587,906 B2 | 7/2003 | Wolrich et al. |
| 6,606,704 B1 | 8/2003 | Adiletta et al. |
| 6,625,654 B1 | 9/2003 | Wolrich et al. |
| 6,631,430 B1 | 10/2003 | Wolrich et al. |
| 6,631,462 B1 | 10/2003 | Wolrich et al. |
| 6,661,794 B1 | 12/2003 | Wolrich et al. |
| 6,667,920 B2 | 12/2003 | Wolrich et al. |
| 6,668,317 B1 | 12/2003 | Bernstein et al. |
| 6,681,300 B2 | 1/2004 | Wolrich et al. |
| 6,694,380 B1 | 2/2004 | Wolrich et al. |

FOREIGN PATENT DOCUMENTS

| | | |
|---|---|---|
| EP | 0 745 933 | 12/1996 |
| EP | 0 809 180 | 11/1997 |
| JP | 59111533 | 6/1984 |
| WO | WO 94/15287 | 7/1994 |
| WO | WO 97/38372 | 10/1997 |
| WO | WO 01/15718 | 3/2001 |
| WO | WO 01/16769 | 3/2001 |

| | | |
|---|---|---|
| WO | WO 01/16770 | 3/2001 |
| WO | WO 01/16782 | 3/2001 |
| WO | WO 01/48596 | 7/2001 |
| WO | WO 01/48606 | 7/2001 |
| WO | WO 01/48619 | 7/2001 |
| WO | WO 01/50247 | 7/2001 |
| WO | WO 01/50679 | 7/2001 |

OTHER PUBLICATIONS

U.S. Appl. No. 10/664,202, filed Sep. 16, 2003, Wolrich et al.

U.S. Appl. No. 10/644,337, filed Aug. 20, 2003, Wolrich et al.

U.S. Appl. No. 10/643,438, filed Aug. 19, 2003, Bernstein et al.

U.S. Appl. No. 10/615,500, filed Jul. 8, 2003, Adiletta.

U.S. Appl. No. 10/615,280, filed Jul. 8, 2003, Wolrich et al.

U.S. Appl. No. 10/440,079, filed May 15, 2003, Wolrich et al.

U.S. Appl. No. 10/208,264, filed Jul. 30, 2002, Adiletta et al.

U.S. Appl. No. 09/476,303, filed Dec. 30, 1999, Wolrich et al.

U.S. Appl. No. 09/475,614, filed Dec. 30, 1999, Wolrich et al.

U.S. Appl. No. 09/473,571, filed Dec. 28, 1999, Wolrich et al.

U.S. Appl. No. 09/387,109, filed Aug. 31, 1999, Adiletta et al.

Byrd et al., "Multithread Processor Architectures," *IEEE Spectrum*, vol. 32, No. 8, New York, Aug. 1, 1995, pp. 38–46.

Doyle et al., *Microsoft Press Computer Dictionary*, 2$^{nd}$ ed., Microsoft Press, Redmond, Washington, USA, 1994, p. 326.

Fillo et al., "The M–Machine Multicomputer," IEEE Proceedings of MICRO–28, 1995, pp. 146–156.

Gomez et al., "Efficient Multithreaded User–Space Transport for Network Computing: Design and Test of the TRAP Protocol," *Journal of Parallel and Distributed Computing*, Academic Press, Duluth, Minnesota, USA, vol. 40, No. 1, Jan. 10, 1997, pp. 103–117.

Haug et al., "Reconfigurable hardware as shared resource for parallel threads," IEEE Symposium on FPGAs for Custom Computing Machines, 1998.

Hauser et al., "Garp: a MIPS processor with a reconfigurable coprocessor," Proceedings of the 5$^{th}$ Annual IEEE Symposium on Field–Programmable Custom Computing Machines, 1997.

Hyde, R., "Overview of Memory Management," *Byte*, vol. 13, No. 4, 1998, pp. 219–225.

Litch et al., "StrongARMing Portable Communications," IEEE Micro, 1998, pp. 48–55.

Schmidt et al., "The Performance of Alternative Threading Architectures for Parallel Communication Subsystems," Internet Document, Online!, Nov. 13, 1998.

Thistle et al., "A Processor Architecture for Horizon," IEEE, 1998, pp. 35–41.

Tremblay et al., "A Three Dimensional Register File for Superscalar Processors," IEEE Proceedings of the 28$^{th}$ Annual Hawaii International Conference on System Sciences, 1995, pp. 191–201.

Trimberger et al., "A time–multiplexed FPGA," Proceedings of the 5$^{th}$ Annual IEEE Symposium on Field–Programmable Custom Computing Machines, 1998.

Turner et al., "Design of a High Performance Active Router," Internet Document, Online, Mar. 18, 1999.

Vibhatavanijt et al., "Simultaneous Multithreading–Based Routers," Proceedings of the 2000 International Conference of Parallel Processing, Toronto, Ontario, Canada, 21–24 Aug. 2000, pp. 362–359.

Wazlowski et al., "PRSIM–II computer and architecture," IEEE Proceedings, Workshop on FPGAs for Custom Computing Machines, 1993.

\* cited by examiner

SCRATCHPAD MEMORY

This application is a continuation of, and claims priority to, U.S. patent application Ser. No. 10/457,337, filed Jun. 9, 2003, now U.S. Pat. No. 6,667, 920, entitled "SCRATCHPAD MEMORY"; which is in turn a continuation of, and claims priority to, U.S. patent application Ser. No. 10/010, 334, filed Oct. 22, 2001, now U.S. Pat. No. 6,577,542 entitled "SCRATCHPAD MEMORY"; which is in turn a continuation of, and claims priority to, U.S. patent application Ser. No. 09/473,111, filed Dec. 28, 1999 now U.S. Pat. No. 6,307,789.

BACKGROUND OF THE INVENTION

Many modern computers have a parallel structure in which several identical processors are capable of performing tasks on incoming instructions and/or data. The parallel structure can handle high instruction and/or data bandwidths if the various tasks are independent. To perform some of the tasks, the processors can access shared resources. Frequently, the shared resources include a data storage device.

SUMMARY OF THE INVENTION

According to one aspect, a integrated circuit includes a random-access memory (RAM) storage and a controller both located on the same semiconductor chip. The controller is coupled to read data from and write data to the RAM storage. The controller is programmable to perform bitwise operations on data words stored in the RAM.

DESCRIPTION

Figure 1:
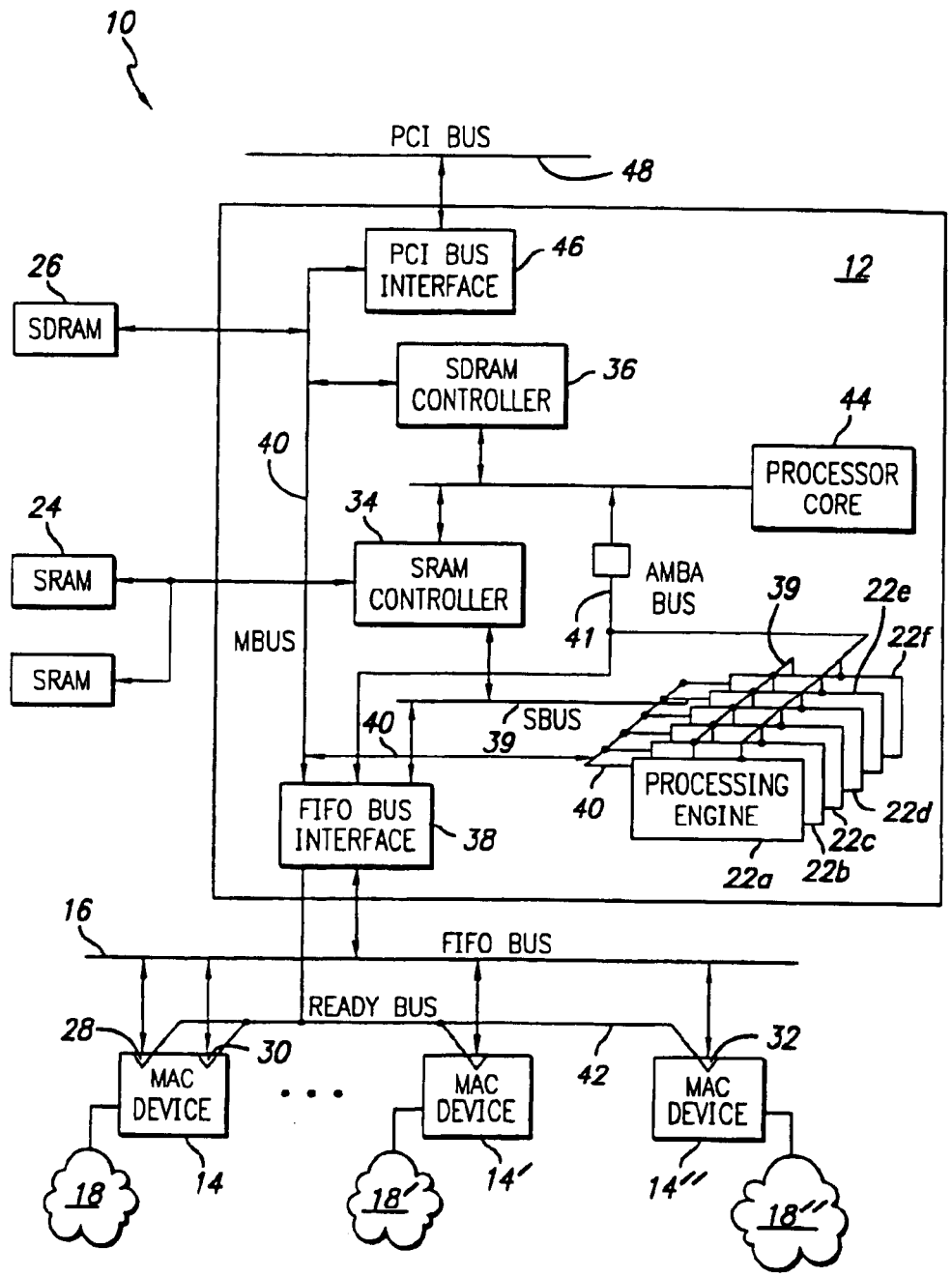
FIG. 1 is a block diagram of a router based on a multi-threaded processor.

FIG. 1 is a block diagram of a router 10 that uses a parallel processor 12, a set of media access chip (MAC) devices 14, 14', 14", and a FIFO bus 16. The router 10 performs data switching between source and destination networks 18, 18', 18" connected to the MAC devices 14, 14', 14". The MAC devices 14, 14', 14" are bridges that couple external networks 18, 18', 18" to the FIFO bus 16. The processor 12 can execute software to control data routing. By basing control on software, the processor 12 may be more easily modified to accommodate new protocols or data characteristics.

The router 10 performs data routing in two stages. First, one of the MAC devices 14, 14', 14" connected to the source network 18, 18', 18" transmits a data packet to the parallel processor 12 via the FIFO bus 16. Second, the parallel processor 12 retransmits the data packet over the FIFO bus 18 to the MAC device 14, 14', 14" connected to the destination network 18, 18', 18". The data transmissions over the FIFO bus 16 employ 64-byte data packets and proceed via an Ethernet protocol.

The parallel processor 12 has a parallel data forwarding structure that includes an array of identical processing engines 22a–22f. Each processing engine 22a–22f has an internal structure for executing a plurality of, e.g., four, independent threads.

Figure 2:
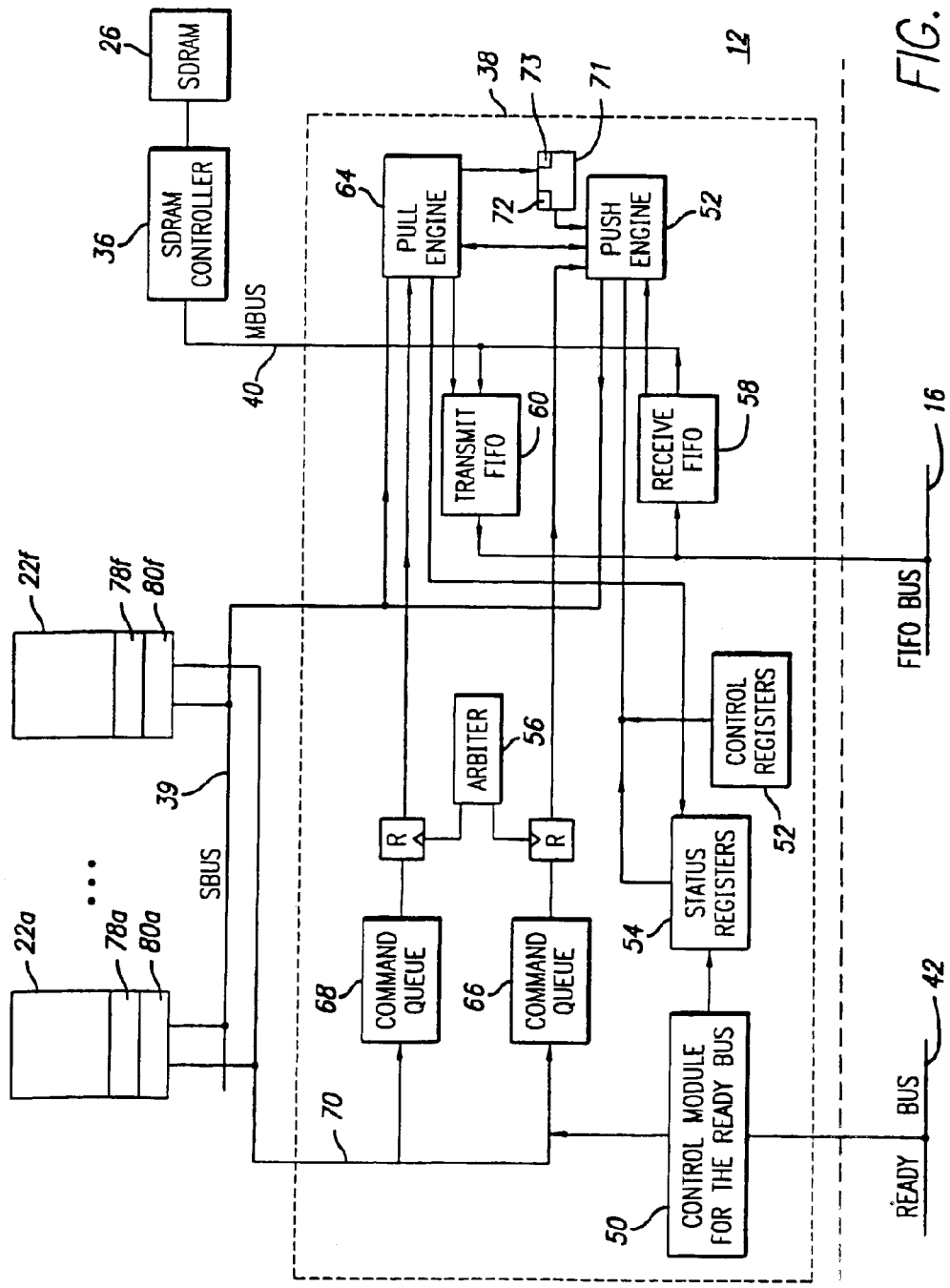
FIG. 2 is a block diagram of a FIFO bus interface of the parallel processor of FIG. 1.

Referring to FIGS. 1 and 2, the processing engines 22a–22f process data packets received from the MAC devices 14, 14', 14". To process a data packet, one of the processing engines 22a–22f looks up routing information in a synchronous random-access memory (SRAM) 24 using information from the packet header. The processing engines 22a–22f also move the data packets from a FIFO buffer 58 to a queue in a synchronous dynamic random-access memory (SDRAM) 26. The FIFO buffer 58 temporarily stores data packets received from the MAC devices 14, 14', 14". The various queues located in the SDRAM 26 are classified by destination MAC device 14, 14', 14" and retransmission priority.

The processing engines 22a–22f also process data from the queues of the SDRAM 26. This processing includes moving data packets from the queues of the SDRAM 26 to a FIFO buffer 60. The FIFO buffer 60 temporarily stores data prior to retransmission to the MAC devices 14, 14', 14" over the FIFO bus 16. Along with the data, associated control and destination information are stored in the FIFO buffer 60 for use in transmitting the data. The associated data is 16 bytes wide.

The SRAM 24 and SDRAM 26 couple to the processing engines 22a–22f through respective SRAM and SDRAM controllers 34, 36. The SRAM controller 34 has content addressable memory that supports look ups of identification information on the queues of the SDRAM 24. The look-ups use header data from received data packets. The SDRAM controller 36 coordinates data writes to and reads from the queues of the SDRAM 24 that store received data packets.

The parallel processor 12 has several internal busses 39, 40, 41. An S bus 39 couples the processing engines 22a–22f to a FIFO bus interface 38 (FBI) and to the SRAM controller 34. An M bus 40 couples the processing engines 22a–22f and the FBI 38 to the SDRAM controller 36 and the SDRAM 26. An AMBA bus 41 couples a processor core 44 to the processing engines 22a–22f and the FBI 38.

The FBI 38 controls data transfers on the FIFO bus 16 and collects status data on the readiness of the ports 28, 30, 32 of the MAC devices 14, 14', 14" to participate in data transfers over the FIFO bus 16. The ready status data is collected from the MAC devices 14, 14', 14" through a ready bus 42, which is also controlled by the FBI 38.

Referring again to FIG. 1, the processor core 44 uses software to perform a variety of functions. The functions may include data packet routing, exception handling, queue management, monitoring of data packet transfers, supporting network management protocols and/or providing local area network emulation.

The parallel processor 12 includes a PCI bus interface 46 that couples to a PCI bus 48. The PCI bus 48 can support communications between the parallel processor 12 and external processors. The other processors may control and/or reprogram the processor core 44 or other components 22a–22f, 38 of the multiprocessor 12.

Referring again to FIG. 2, the connections between the FBI 38 and the processing engines 22a–22f are shown. The FBI 38 includes a control module 50 for the ready bus 42 and a push engine 62. The control module 50 periodically collects receive-ready status data and transmit-ready status data from the MAC devices 14, 14', 14". The collected ready status data is stored in a set of status registers 54. The set includes separate registers for storing receive-ready status data and transmit-ready status data. The push engine 62 regularly sends the ready status data over the S bus 39 to scheduler threads located in the processing engines 22a–22f in response to commands from logic internal to the FBI 38.

The processing engines 22a–22f include separate receive-scheduler and transmit-scheduler threads. The receive-scheduler thread schedules the processing of data received from the FIFO bus 16. The transmit-scheduler thread schedules the processing of data to be transmitted to the FIFO bus 16.

The receive-scheduler thread assigns data forwarding and header processing tasks to other threads in the processing engines 22a–22f. These tasks include sharing operation of a push engine 62 that transports data from the receive FIFO buffer 58 in the FBI 38 to one of the storage queues in the SDRAM 26.

The transmit-scheduler thread also assigns data forwarding tasks to other threads in the processing engines 22a–22f. These tasks include sharing in operation of a pull engine 64, which moves data from the storage queues in the SDRAM 26 to the transmit FIFO buffer 60. The tasks also include directing the pull engine 62 to write transmission control and MAC device 14, 14', 14" address information to the FIFO buffer 60. Each data packet in the transmit FIFO buffer 60 has associated address and control information that control the retransmission over the FIFO bus 16.

To control data forwarding by the push and pull engines 62, 64, the execution threads of the processing engines 22a–22f send commands signals to FIFO command queues 66, 68 via a line 70. Components of the FBI 38 can also send commands to the command queues 66, 68 of push and pull engines 62, 64. For example, the ready bus controller 50 can send a command to the queue 66 that causes the push engine 62 to transfer ready status data from the status registers 54 to the processing engines 22a–22f. An arbiter 56 controls transmission of commands from the queues 66, 68 to the push and pull engines 62, 64.

The push and pull engines 62, 64 perform several types of tasks. The push and the pull engines 62, 64 are involved in bi-directional forwarding of data packets between the FIFO buffers 58, 60 and the SDRAM controller 36. The push and pull engines 62, 64 also operate a large hardware unit 71 located in the FBI 38. The push engine 62 also forwards ready status data from the set of status registers 54 to the receive- and transmit-scheduler threads located in the processing engines 22a–22f.

The hardware unit 71 performs various operations for the execution threads of the processing engines 22a–22f and includes a hash unit 72 and a scratchpad memory 73. The execution threads operate the hardware unit 71 by sending commands to the queues 66, 68. To perform the operations, the pull engine 64 retrieves input data over the S bus 39 from output transfer registers 80a–80f of the requesting processing engine 22a–22f. The pull engine 64 moves the retrieved data and associated commands to the hardware unit 71. The hardware unit 71 forwards results from the operations to the push engine 62. The push engine 62 uses command information from the command queue 66 and/or pull engine 64 to transmit the results back over the S bus 39 to input transfer registers 78a–78f of the requesting or destination processing engine 22a–22f.

Figure 3:
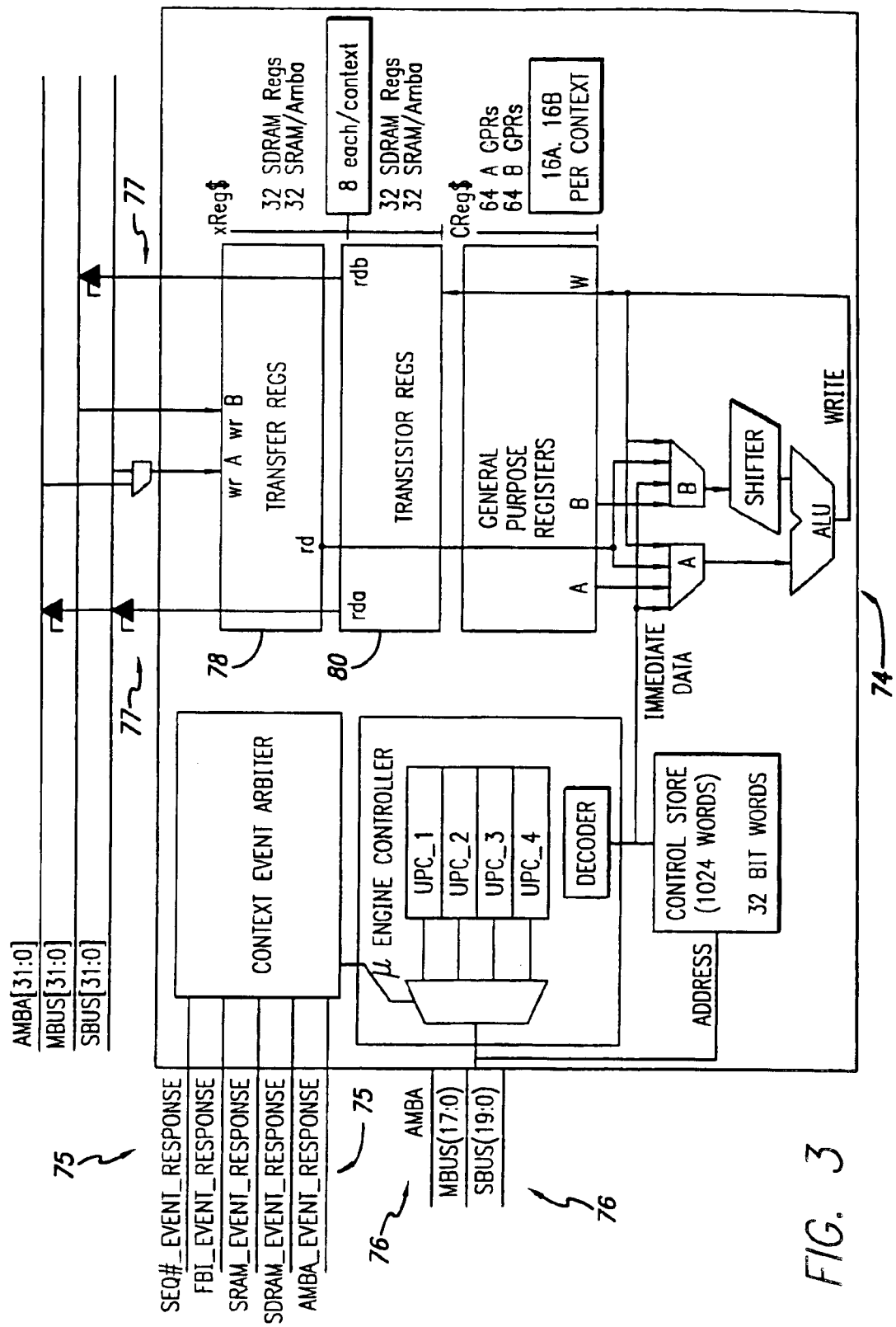
FIG. 3 is a block diagram of one of the parallel processing engines used by the multithreaded processor of FIG. 1.

Referring to FIG. 3, one embodiment 74 of the processing engines 22a–22f is shown. The processing engines 22a–22f have input/output terminals 75–77 for control signals, address signals, and data. Control signals, address signals, and data are transferred to and from the processing engines 22a–22f over three busses, i.e., the M bus 40, the S bus 39, and the AMBA bus 41. The address signals identify both a processing engine 22a–22f and an execution thread so that external commands can independently address different threads. Data is received at and transmitted from respective input and output transfer registers 78, 80. Each input and output transfer register 78, 80 is assigned to an individual execution thread. To write data to or read data from a particular execution thread, an external device accesses one of the transfer registers 78, 80 assigned to the particular thread.

Figure 4:
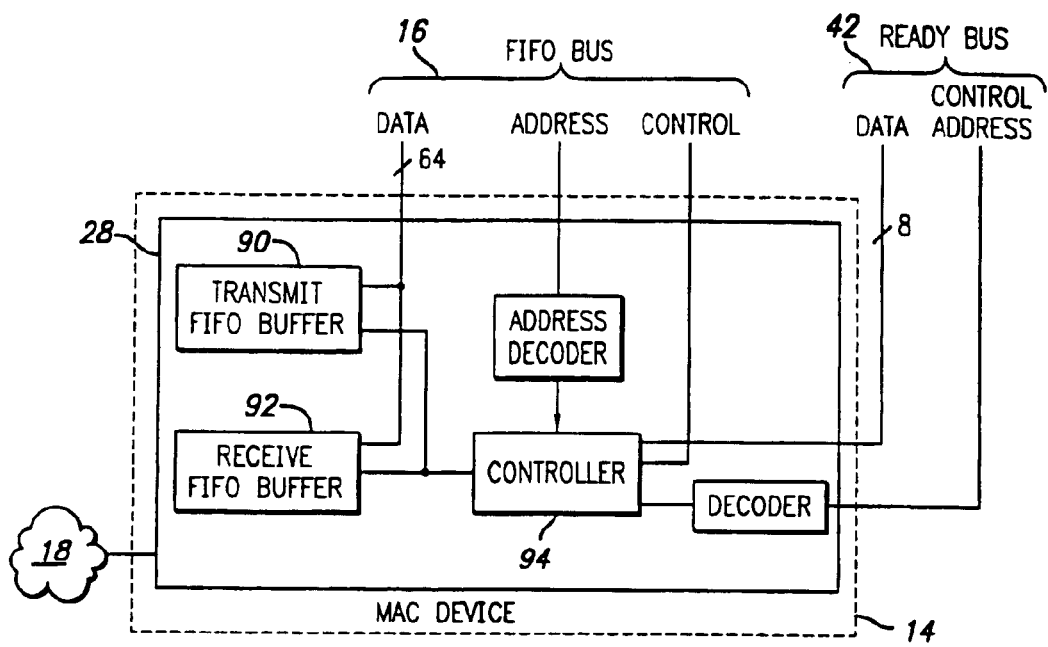
FIG. 4 is a block diagram of a MAC port coupled to the multithreaded processor of FIG. 1.

Referring to FIG. 4, the port 28 of the MAC device 14 is shown. The port 28 has transmit and receive FIFO buffers 90, 92 for storing data prior to transmission to and after reception from the FIFO bus 16, respectively. Both buffers 90, 92 have entries of fixed size that are multiples of 64 bytes, i.e., the size of data packets on the FIFO bus 16. The port 28 also includes address decoders and a controller 94. The controller 94 controls both protocol transfers over the FIFO bus 16 and responses to ready status queries from the ready bus 42. The responses to the queries indicate whether the transmit buffer 90 has a 64 byte data packet to transmit and/or whether the receive buffer 92 has space to receive a 64 byte data packet.

The various ports 28, 30, 32 of the MAC devices 14, 14', 14" may support different data transfer rates. The ports 28, 30 of the MAC devices 14, 14' support transfer rates of about ten or one hundred megabits of data per second. The port 32 of the MAC device 14" may have a transfer rate of up to about one gigabit per second.

The ready bus 42 includes control/address and data lines. The control/address lines enable selection of a transaction type and a port 28, 30, 32 of the MAC devices 14, 14', 14". The data line transfers receive- and transmit-ready status data to the FBI 38 in response to status queries from the control module 50 for the ready bus 42.

Referring to 5A, the registers $R_1$, $R_2$, $R_3$ that store receive-ready status data are shown. The registers $R_1$ and $R_2$ store receive-ready status data for individual MAC ports 28, 30, 32. The readiness of each MAC port 28, 30, 32 to transmit a data packet to the FIFO bus 16 is indicated by the value of an associated bit or flag stored in one of the registers $R_1$, $R_2$. One logic value of the bit or flag indicates that the associated port 28, 30, 32 has a data packet ready to transmit, and the other logic value indicates the associated port 28, 30, 323 has no ready data packets. Different ports 28, 30, 32 may have data packets of different sizes, but the receive scheduler thread knows the packet size associated with each port 28, 30, 32.

The registers $R_2$ and $R_3$ have 32 bits each and thus, can accommodate receive-ready status data for up to 64 different MAC ports 28, 30, 32.

The register $R_3$ stores a cyclic counter value, which acts as a time stamp for the receive-status data stored in registers $R_1$, $R_2$. The counter value is incremented each time new receive-status data is collected. By comparing the counter value to a previously received counter value, the scheduler thread can determine whether the present receive-status data is new or stale, i.e., whether the data has already been seen.

Figure 5A:
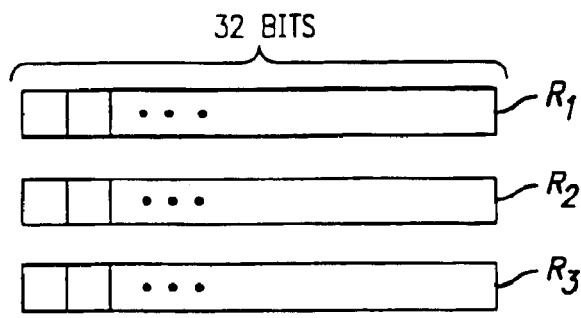
FIG. 5A shows the status registers for receive-status data.
Figure 5B:
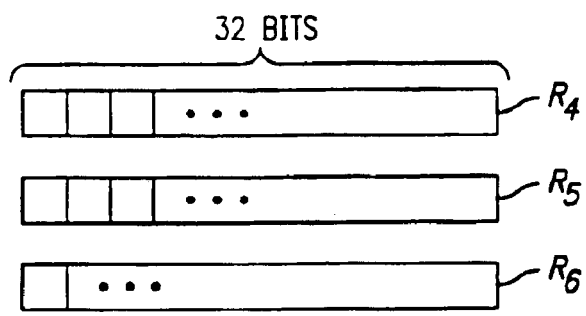
FIG. 5B shows the status registers for transmit-status data.

Referring to FIG. 5B, the registers $R_4$, $R_5$, $R_6$ that store transmit-ready status data are shown. The registers $R_4$ and $R_4$ store transmit-ready status data for individual MAC ports 28, 30, 32. Each MAC port 28, 30, 32 has an associated bit or flag in one of the registers $R_4$ and $R_4$. One logic value of the bit or flag indicates that the associated port 28, 30, 32 has enough space to receive a data packet, and the other logic value indicates the associated port 28, 30, 32 does not have enough space.

The registers $R_4$ and $R_5$ have a total of 64 bits and thus, can report transmit ready status for up to 64 MAC ports 28, 30, 32.

Figure 5C:
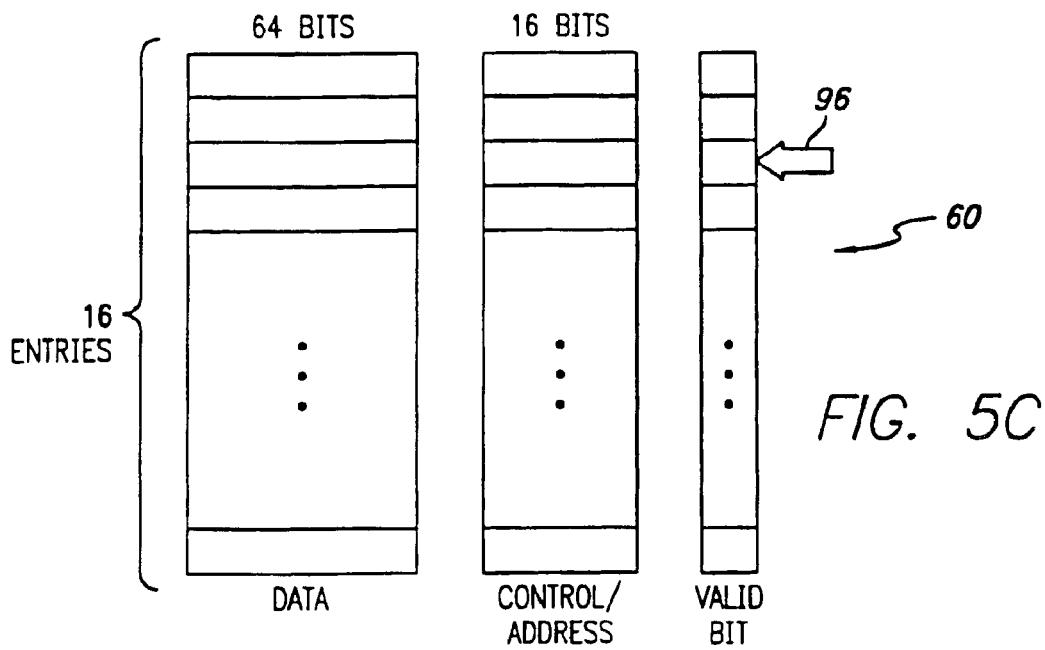
FIG. 5C shows the transmit FIFO buffer located in the FIFO bus interface of FIG. 2.

Referring to FIG. 5C, the number stored in register $R_6$ indicates the position of a remove pointer 96 in the transmit FIFO buffer 60. For an embodiment in which the transmit FIFO buffer 60 has sixteen entries, the position of the remove pointer is represented as a 4-bit number.

Since the FBI 38 transmits 64-byte data packets from the buffer 60 according to a FIFO scheme, the remove pointer 96 indicates which data packets are scheduled but not transmitted. The position of the pointer 96 can be used to determine which MAC ports 28, 30, 32 have been scheduled to receive a data packet but have not yet received a data packet. Such ports 28, 30, 32 may have status data in registers $R_4$, $R_5$ indicating an availability to receive a data packet even though the available space has already been assigned to a waiting data packet.

The transmit scheduler thread can use the position of the remove pointer 96 to interpret transmit-ready status data of the registers $R_4$, $R_5$. From the position of the remove pointer 96, the transmit scheduler thread identifies MAC ports 28, 30, 32 already scheduled to receive a data packet. The transmit scheduler thread does not schedule a new data packet for such ports, because the waiting and already scheduled data packet may take the available space therein.

In the multiprocessor 12, the collection of ready status data is asynchronous with respect to scheduling of data packet transfers. The asynchronous relationship enables both the collection of ready status data and the scheduling of data packets to have higher effective bandwidths. The asynchronous relationship also introduces some unpredictability into latencies associated with the transfer of newly collected ready status data to scheduler threads.

Figure 6:
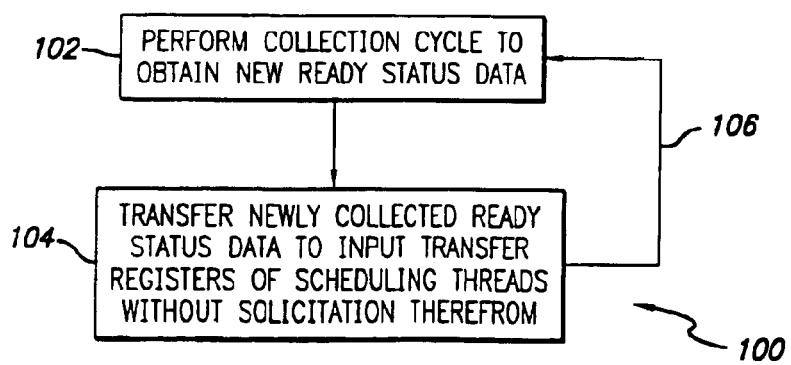
FIG. 6 is a flow chart showing a process for providing ready-status data to scheduler threads.

Referring to FIG. 6, a process 100 by which the FBI 38 provides ready status data to the scheduler threads is shown. The FBI 38 performs 102 a collection cycle in which new ready status data is obtained from the MAC devices 14, 14', 14" interactively via the ready bus 42. In response to completing the collection cycle, the FBI 38 performs an unsolicited transfer 104 of the newly collected ready status data to the input transfer registers 78a–78f assigned to the scheduler threads. In an unsolicited data transfer, the destination device for the transfer does not request the transfer. The transfer of ready status data from the FBI 38 to destination processing engines 22a–22f and scheduling threads proceeds without any request from the processing engines 22a–22f. Instead, the FBI 38 automatically performs the transfer in response to finishing a collection cycle for the ready status data. The completion of each collection cycle causes issuance of a command to the push engine 62, which transfers the ready bus data to the processing engines 22a–22f. After completing the transfer, the FBI 38 loops back 106 to collect new ready status data.

Making transfers of new ready status data unsolicited lowers latencies for delivering such data to scheduler threads. Since latencies in delivering such data can cause scheduling errors, making the transfer of ready status data unsolicited can lower numbers of occurrences of scheduling errors. The data is transmitted from respective input and output transfer registers 78, 80. Each input and output transfer register 78, 80 is assigned to an individual execution thread. To write data to or read data from a particular execution thread, an external device accesses one of the transfer registers 78, 80 assigned to the particular thread.

Referring to FIG. 4, the port 28 of the MAC device 14 is shown. The port 28 has transmit and receive FIFO buffers 90, 92 for storing data prior to transmission to and after reception from the FIFO bus 16, respectively. Both buffers 90, 92 have entries of fixed size that are multiples of 64 bytes, i.e., the size of data packets on the FIFO bus 16. The port 28 also includes address decoders and a controller 94. The controller 94 controls both protocol transfers over the FIFO bus 16 and responses to ready status queries from the ready bus 42. The responses to the queries indicate whether the transmit buffer 90 has a 64 byte data packet to transmit and/or whether the receive buffer 92 has space to receive a 64 byte data packet.

The various ports 28, 30, 32 of the MAC devices 14, 14', 14" may support different data transfer rates. The ports 28, 30 of the MAC devices 14, 14' support transfer rates of about ten or one hundred megabits of data per second. The port 32 of the MAC device 14" may have a transfer rate of up to about one gigabit per second.

The ready bus 42 includes control/address and data lines. The control/address lines enable selection of a transaction type and a port 28, 30, 32 of the MAC devices 14, 14', 14". The data line transfers receive- and transmit-ready status data to the FBI 38 in response to status queries from the control module 50 for the ready bus 42.

Referring to FIG. 5A, the registers $R_1$, $R_2$, $R_3$ that store receive-ready status data are shown. The registers $R_1$ and $R_2$ store receive-ready status data for individual MAC ports 28, 30, 32. The readiness of each MAC port 28, 30, 32 to transmit a data packet to the FIFO bus 16 is indicated by the value of an associated bit or flag stored in one of the registers $R_1$, $R_2$. One logic value of the bit or flag indicates that the associated port 28, 30, 32 has a data packet ready to transmit, and the other logic value indicates the associated port 28, 30, 323 has no ready data packets. Different ports 28, 30, 32 may have data packets of different sizes, but the receive scheduler thread knows the packet size associated with each port 28, 30, 32.

The registers $R_2$ and $R_3$ have 32 bits each and thus, can accommodate receive-ready status data for up to 64 different MAC ports 28, 30, 32.

The register $R_3$ stores a cyclic counter value, which acts as a time stamp for the receive-status data stored in registers $R_1$, $R_2$. The counter value is incremented each time new receive-status data is collected. By comparing the counter value to a previously received counter value, the scheduler thread can determine whether the present receive-status data is new or stale, i.e., whether the data has already been seen.

Referring to FIG. 5B, the registers $R_4$, $R_5$, $R_6$ that store transmit-ready status data are shown. The registers $R_4$ and $R_4$ store transmit-ready status data for individual MAC ports 28, 30, 32. Each MAC port 28, 30, 32 has an associated bit or flag in one of the registers $R_4$ and $R_4$. One logic value of the bit or flag indicates that the associated port 28, 30, 32 has enough space to receive a data packet, and the other logic value indicates the associated port 28, 30, 32 does not have enough space.

The registers $R_4$ and $R_5$ have a total of 64 bits and thus, can report transmit ready status for up to 64 MAC ports 28, 30, 32.

Referring to FIG. 5C, the number stored in register $R_6$ indicates the position of a remove pointer 96 in the transmit FIFO buffer 60. For an embodiment in which the transmit FIFO buffer 60 has sixteen entries, the position of the remove pointer is represented as a 4-bit number.

Since the FBI 38 transmits 64-byte data packets from the buffer 60 according to a FIFO scheme, the remove pointer 96 indicates which data packets are scheduled but not transmitted. The position of the pointer 96 can be used to determine which MAC ports 28, 30, 32 have been scheduled to receive a data packet but have not yet received a data packet. Such ports 28, 30, 32 may have status data in registers $R_4$, $R_5$ indicating an availability to receive a data packet even though the available space has already been assigned to a waiting data packet.

The transmit scheduler thread can use the position of the remove pointer 96 to interpret transmit-ready status data of the registers $R_4$, $R_5$. From the position of the remove pointer 96, the transmit scheduler thread identifies MAC ports 28, 30, 32 already scheduled to receive a data packet. The transmit scheduler thread does not schedule a new data packet for such ports, because the waiting and already scheduled data packet may take the available space therein.

In the multiprocessor 12, the collection of ready status data is asynchronous with respect to scheduling of data packet transfers. The asynchronous relationship enables both the collection of ready status data and the scheduling of data packets to have higher effective bandwidths. The asynchronous relationship also introduces some unpredictability into latencies associated with the transfer of newly collected ready status data to scheduler threads.

Referring to FIG. 6, a process 100 by which the FBI 38 provides ready status data to the scheduler threads is shown. The FBI 38 performs 102 a collection cycle in which new ready status data is obtained from the MAC devices 14, 14', 14" interactively via the ready bus 42. In response to completing the collection cycle, the FBI 38 performs an unsolicited transfer 104 of the newly collected ready status data to the input transfer registers 78a–78f assigned to the scheduler threads. In an unsolicited data transfer, the destination device for the transfer does not request the transfer. The transfer of ready status data from the FBI 38 to destination processing engines 22a–22f and scheduling threads proceeds without any request from the processing engines 22a–22f. Instead, the FBI 38 automatically performs the transfer in response to finishing a collection cycle for the ready status data. The completion of each collection cycle causes issuance of a command to the push engine 62, which transfers the ready bus data to the processing engines 22a–22f. After completing the transfer, the FBI 38 loops back 106 to collect new ready status data.

Making transfers of new ready status data unsolicited lowers latencies for delivering such data to scheduler threads. Since latencies in delivering such data can cause scheduling errors, making the transfer of ready status data unsolicited can lower numbers of occurrences of scheduling errors.

Figure 7:
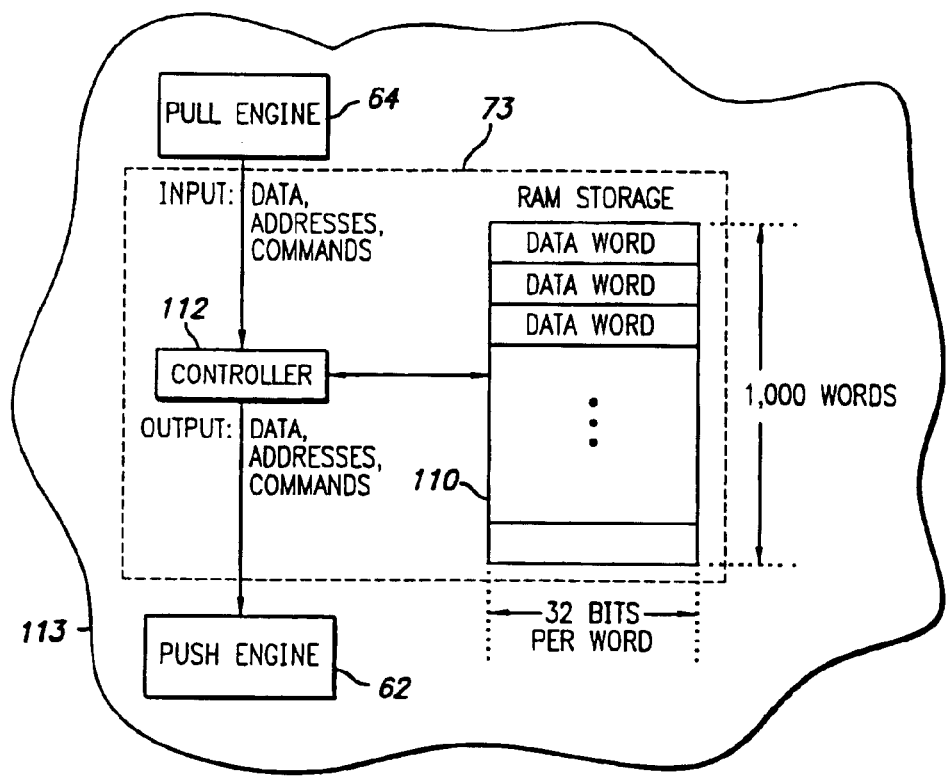
FIG. 7 is a block diagram of a shared scratchpad memory.

Referring to FIG. 7, the scratchpad memory 73 is shown. The scratchpad memory 73 includes RAM storage 110 and a controller 112 to operate the RAM storage 110. The RAM storage 110 can store, e.g., about 1,024 words having lengths of 32 bits each. The controller 112 has decode and control hardware that provide read and write operations for accessing the RAM storage 110. The controller 112 has additional hardware that provides support for performing bitwise operations on individual data words stored in the RAM storage 110.

The scratchpad memory 73 interfaces with other devices through the pull and push engines 64, 62. The pull engine 64 provides input commands, data and associated storage addresses to the controller 112. The data may include data words to write to the scratchpad memory 73 and mask words that define bit locations affected by the bitwise operations in the scratchpad memory 73. The push engine 62 receives output commands, data, and associated destination addresses from the controller 112. In some embodiments, the push engine 62 also sends read commands to the controller 112, because reads only require command and address signals, i.e., no data is inputted to the scratchpad memory 73.

The pull and push engines 64, 62 enable any of the processing engines 22a–22f to use the scratchpad memory 73. The scratchpad memory 73 is a shared on-chip resource. The processing engines 22a–22f and FBI 38, including the scratchpad memory 73, are parts of one integrated circuit, which is located on a semiconductor chip 113. The processing engines 22a–22f share the on-chip scratchpad memory 73 to store data and perform bitwise operations on data. Using a shared resource to perform rare operations and provide storage can reduce overall hardware costs associated with the large array of processing engines 22a–22f.

The bitwise operations performed by the scratchpad memory 73 include set, clear, "test and set", "test and clear", and increment operations. Each bitwise operation uses a 32 bit mask received from the pull engine 64. The mask defines locations at which bitwise manipulations will be performed, e.g., by locations of bits with the value 1 in the mask.

Figure 8A:
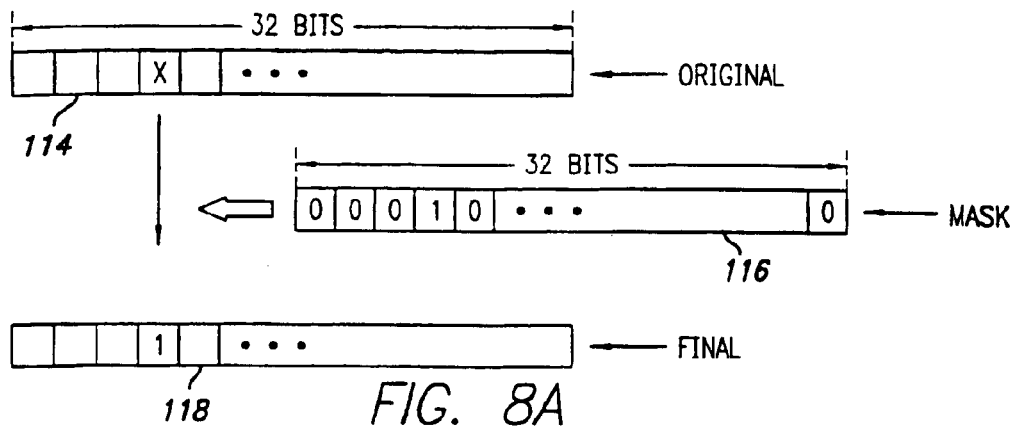
FIG. 8A shows a bitwise set operation on a data word.
Figure 8B:
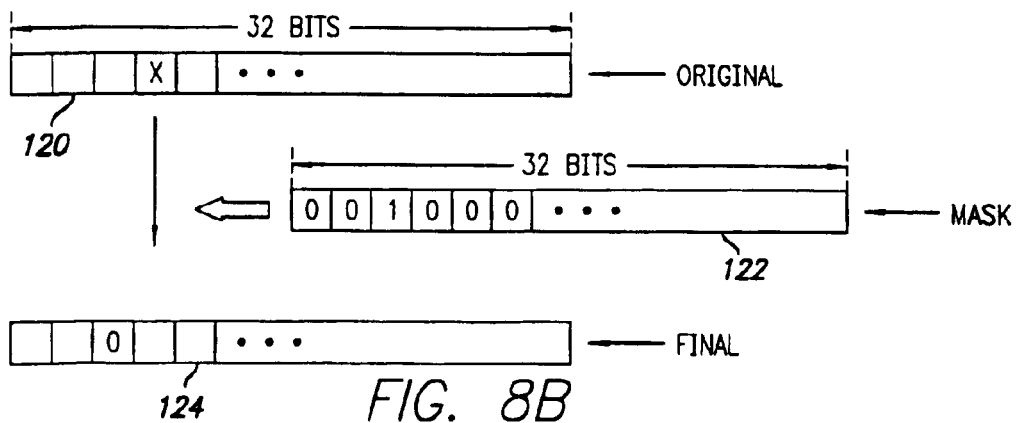
FIG. 8B shows a bitwise clear operation on a data word.
Figure 8C:
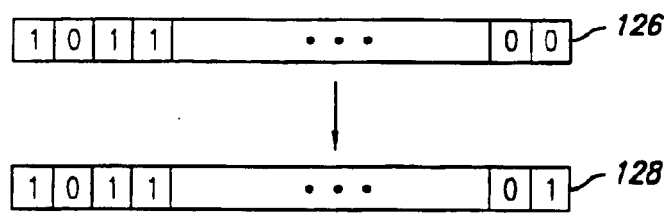
FIG. 8C shows a bitwise increment operation on a data word.

FIGS. 8A–8C illustrate the bitwise set, clear, and increment operations performed by the scratchpad memory 73. The bitwise operations act on single words from the RAM storage 110.

Referring to FIG. 8A, the action of the bitwise "set" operation on a data word 114 is shown. The "set" operation sets selected bits of the data word 114 to the value 1. The bit selection is defined by a mask word 116 having the same size as the data word 114. Each location of the data word for which the same bit location in the mask word has the value 1 is selected for the set operation. For the mask word 116, the set operation produces the final word 118 from the data word 114.

Referring to FIG. 8B, the action of the bitwise "clear" operation on a data word 120 is shown. The "clear" operation fixes selected bits of the data word 120 to the value 0. Again, bit selection is defined by a mask word 122 having the same size as the data word 120. Each location of the data word for which the same location in the mask word has the value 1 is selected for the clear operation. For the mask word 122, the clear operation produces the final word 124 from the data word 120.

Referring to FIG. 8C, the action of the bitwise increment operation on a data word 126 is shown. The increment operation adds 1 to the data word 126 to produce a final data word 128. The increment operation can be used to implement a cyclic counter in the scratchpad memory 73.

Figure 9:
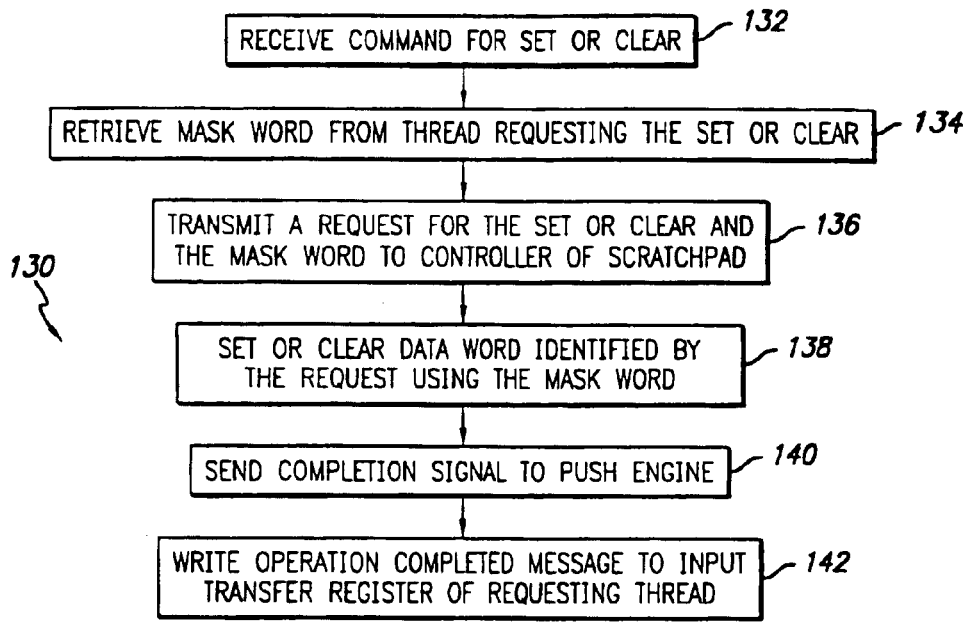
FIG. 9 is a flow chart showing a process for performing bitwise set and clear operations.

Referring to FIG. 9, a process 130 by which the FBI 38 performs the set or clear operations is shown. The operation starts when the pull engine 64 receives 132 a command to perform a set or clear operation from one of the execution threads. The command identifies an address in the scratchpad memory 73 of a data word to be set or cleared. In response to the command, the pull engine 64 retrieves 134 a mask word from the output transfer register 80a–80f associated with the thread requesting the operation. The pull engine 64 transmits 136 a request for the set or clear, as appropriate, and the retrieved mask word to the controller 112 of the scratchpad memory 73. The controller 112 sets or clears 138 a data word of the RAM storage 110. The request identifies the address of the data word to be set or cleared. The bits being set or cleared are defined by the mask word transmitted by the pull engine 64 as already described. After completing the set or clear, the controller 112 sends 140 a completion signal to the push engine 62. The push engine 62 writes 142 an operation completed message to an input transfer register 80a of the execution thread that requested the operation.

Figure 10:
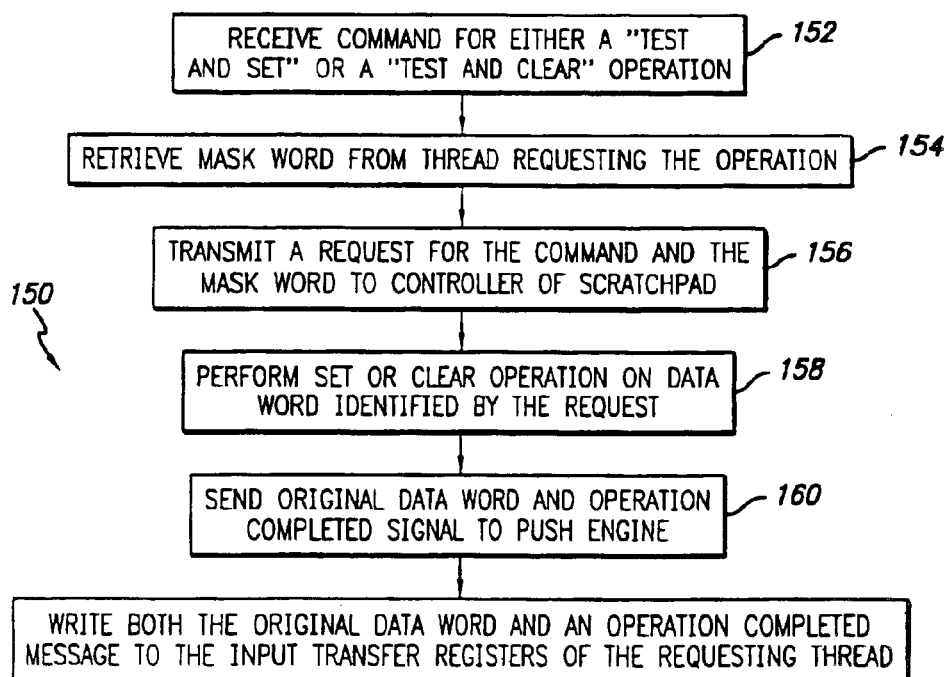
FIG. 10 is a flow chart showing a process for performing a bitwise "test and set" and "test and clear" operations.

Referring to FIG. 10, a process 150 by which FBI performs a "test and set" or a "test and clear" operation is shown. The pull engine 64 receives 152 a command to perform a "test and set" or a "test and clear" operation from one of the execution threads. The command identifies the address of the data word of the scratchpad memory 73 upon which the operation will act. The pull engine 64 retrieves 154 a mask word from an output transfer register 80a–80f assigned to the thread requesting the operation. The pull engine 64 transmits 156 a request for the command and the mask word to the controller 112 of the scratchpad memory 73.

The controller 112 performs 156 a set or clear operation on a data word stored in the RAM storage 110. If the command is for a "test and set", the set operation is performed. If the command is for a "test and clear", the clear operation is performed. In either case, the form of the operation performed is defined by the transmitted mask word as already described.

After completing the appropriate operation, the controller 112 sends 158 both the original data word and operation completed signal to the push engine 62. The push engine 62 writes 160 the original data word and an operation completed message to input transfer registers 80a of the execution thread that requested the operation. Thus, the requesting thread can determine from the data word received whether the set or clear operation has resulted in a change to the data word.

While various embodiments have been described in the detailed description, the description is intended to illustrate and not to limit the scope of the invention, which is defined by the appended claims. Other aspects, advantages, and modifications are within the scope of the claims.

What is claimed is:

1. A processor, comprising:
multiple multi-threaded engines integrated on a single semiconductor chip;
a random access memory integrated on the same semiconductor chip; and
a first memory controller integrated on the same semiconductor chip, the memory controller coupled to the random access memory and coupled to the multiple multi-threaded engines, the memory controller to receive and respond to commands issued by the multiple multi-threaded engines.

2. The processor of claim 1,
wherein the commands received by the first memory controller comprise at least one command specifying bit-wise operations on a location within the random access memory.

3. The processor of claim 1,
wherein the commands received by the first memory controller comprise at least one test-and-set command.

4. The processor of claim 1,
further comprising a single-threaded processor integrated on the same semiconductor chip, the single-threaded processor having a different architecture than at least one of the multiple multi-threaded engines.

5. The processor of claim 1, further comprising a host interface integrated on the same semiconductor chip.

6. The processor of claim 5, wherein the host interface comprises a Peripheral Component Interconnect (PCI) interface.

7. The processor of claim 1, further comprising an interface that is integrated on the same semiconductor chip, the interface comprising an interface to a network component to send and receive packets.

8. The processor of claim 7, wherein the interface comprises an interface to a link layer device.

9. The processor of claim 8, wherein the interface comprises an interface to a bus coupling the network component to the processor.

10. The processor of claim 1, further comprising a second memory controller integrated on the same semiconductor chip, the second memory controller to interface to a random access memory not integrated on the same semiconductor chip, the second memory controller coupled to the multiple multi-threaded engines and to receive and respond to commands received from the multiple multi-threaded engines.

11. The processor of claim 1, further comprising dedicated hash logic integrated on the same semiconductor chip, the dedicated hash logic coupled to the multiple multi-threaded engines.

12. The processor of claim 1, wherein each of the multiple multi-threaded engines comprises:
an instruction control store to store instructions associated with multiple threads;
registers to store multiple contexts respectively associated with the multiple threads, each context comprising a program counter identifying an execution location within a one of the associated threads; and
an arbiter to select a one of the program counters associated with a one of the threads to execute.

13. The processor of claim 1, further comprising:
a host interface integrated on the same semiconductor chip;
an interface, integrated on the same semiconductor chip, to a network component to send and receive packets; and
a second memory controller integrated on the same semiconductor chip, the second memory controller to interface to a random access memory not integrated on the same semiconductor chip, the second memory controller coupled to the multiple multi-threaded engines and to receive and respond to commands received from the multiple multi-threaded engines.

* * * * *